(12) United States Patent
Kinoshita et al.

(10) Patent No.: US 7,060,370 B2
(45) Date of Patent: Jun. 13, 2006

(54) ORGANIC EL ELEMENT AND ORGANIC EL DISPLAY

(75) Inventors: Masaru Kinoshita, Kawasaki (JP);
Wataru Sotoyama, Kawasaki (JP); Jun Kodama, Kawasaki (JP); Yasuo Okamoto, Kawasaki (JP)

(73) Assignee: Fuji Photo Film., Ltd., Kanagawa (JP)

( * ) Notice: Subject to any disclaimer, the term of this patent is extended or adjusted under 35 U.S.C. 154(b) by 168 days.

(21) Appl. No.: 10/278,866

(22) Filed: Oct. 24, 2002

(65) Prior Publication Data
US 2003/0157365 A1    Aug. 21, 2003

(30) Foreign Application Priority Data
Feb. 6, 2002 (JP) .............................. 2002-029335

(51) Int. Cl.
*H05B 33/12* (2006.01)

(52) U.S. Cl. ............... 428/690; 428/917; 313/504; 313/506; 257/40; 257/89

(58) Field of Classification Search ............... 428/690, 428/917; 313/504, 506; 250/2 U; 257/88, 257/89; 252/301.16
See application file for complete search history.

(56) References Cited

U.S. PATENT DOCUMENTS

| | | | | |
|---|---|---|---|---|
| 4,085,321 A | * | 4/1978 | Sliva | 250/214.1 |
| 5,405,724 A | * | 4/1995 | Hsieh et al. | 430/58.8 |
| 5,708,931 A | * | 1/1998 | Foley et al. | 399/159 |
| 6,783,872 B1 | * | 8/2004 | Sotoyama et al. | 428/690 |
| 2003/0186081 A1 | * | 10/2003 | Sotoyama et al. | 428/690 |

FOREIGN PATENT DOCUMENTS

| | | |
|---|---|---|
| JP | 5-32596 | 2/1993 |
| JP | 5-190283 | 7/1993 |
| JP | 5-194943 | 8/1993 |
| JP | 6-219973 | 8/1994 |
| JP | 07-110940 | 4/1995 |
| JP | 8-259940 | 10/1996 |
| JP | 10-289786 | 10/1998 |
| JP | 11-87057 | 3/1999 |
| JP | 11-273864 | 10/1999 |
| JP | 2000-26337 | 1/2000 |
| JP | 2001-102172 | 4/2001 |
| JP | 2001-118682 | 4/2001 |

OTHER PUBLICATIONS

C. W. Tang and S. A. VanSlyke; Organic electroluminescent diodes; Applied Physics Letters; vol. 51(12); pp. 913-915 (1987).

C. W. Tang, S. A. VanSlyke, and C. H. Chen; Electroluminescence of doped organic thin films; Journal of Applied Physics; vol. 65(9); pp. 3610-3616 (1989).

* cited by examiner

*Primary Examiner*—Rena Dye
*Assistant Examiner*—Camie S. Thompson
(74) *Attorney, Agent, or Firm*—Birch, Stewart, Kolasch & Birch, LLP

(57) ABSTRACT

An organic EL element comprising an organic thin film layer containing a light-emitting layer between an positive electrode and a negative electrode, in which a layer in the organic thin film layer comprises 1,3,6,8-tetraphenylpyrene compound expressed by the following structural formula (1), and a carbazole derivative expressed by the following structural formula (2),
in the structural formula (1), $R^1$–$R^4$ may be identical or different, and may be a hydrogen atom or a substituent group,
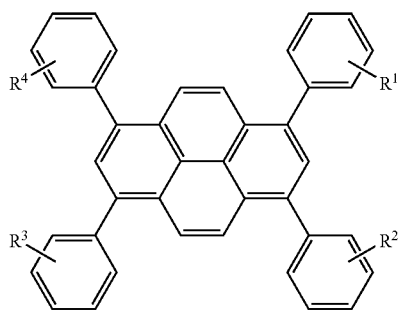
Structural formula (1)
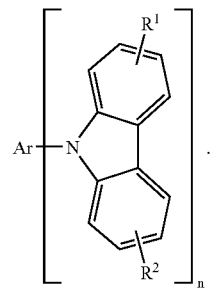
Structural formula (2)
15 Claims, 5 Drawing Sheets

ORGANIC EL ELEMENT AND ORGANIC EL DISPLAY

CROSS-REFERENCE TO RELATED APPLICATIONS

This application is based upon and claims the benefit of priority from the prior Japanese Patent Application No. 2002-29335, filed in Feb. 6, 2002, the entire contents of which are incorporated herein by reference.

BACKGROUND OF THE INVENTION

1. Field of the Invention

The present invention relates to an organic EL element, and to an organic EL display which utilizes the organic EL element.

2. Description of the Related Art

Organic EL elements have features such as spontaneous light emission, high-speed response, and the like, and they are expected to be applied to flat panel displays. A two-layer (laminated) organic thin film having positive hole transporting properties (positive hole transporting layer) and organic thin film having electron transporting properties (electron transporting layer) has been reported (C. W. Tang and S. A. VanSlyke, *Applied Physics Letters* vol. 51, and 913 (1987)), and due to its large area light-emitting element which emits light at a low voltage of 10V or less, it has recently been attracting attention. Organic EL elements of the laminated type have the basic construction, positive electrode/positive hole transporting layer/light-emitting layer/electron transporting layer/negative electrode, wherein the functions of the positive hole transporting layer or electron transporting layer may be added to that of the light-emitting layer as in the two-layer type.

It is expected that organic EL elements will soon be applied to full color displays. In this full color display, it is necessary to have pixels emitting light of three primary colors, blue (B), green (G) and red (R) arranged on the panels. There are three methods for achieving such arrangements;

(a) providing three types of organic EL elements, blue (B), green (G), red (R),
(b) separating the light emission light from an organic EL element emitting white light (which is a mixture of blue (B), green (G) and red (R) light) by color filters,
(c) converting the light emission from an organic EL element emitting blue light into green (G) and red (R) light emission by a color conversion layer using fluorescent light.

In all of these systems, blue (B) light emission is indispensable, so it is desirable to provide an organic EL element of high luminance, high efficiency and high color purity which emits blue light.

As an example of an organic EL element emitting blue colored light, an organic EL element using pyrene, which is a type of aromatic condensed ring compound, or an alkyl derivative or cycloalkyl derivative thereof as a luminescent material, has for example been disclosed in Japanese Patent Application Laid-Open (JP-A) No. 09-241629. However, as the fluorescence quantum yield in this luminescent material was small in this organic EL element, there was a problem in that the purity of blue light emission was not sufficient. JP-A No. 2001-118682 proposes an organic EL element showing blue fluorescence of high color purity, and in particular a large fluorescence quantum yield, using 1,3,6,8-tetraphenylpyrene and its derivatives (the fluorescence quantum yield of 1,3,6,8-tetraphenylpyrene is as high as 0.9 compared to the fluorescence quantum yield of an unsubstituted pyrene which is 0.3). However, in this organic EL element, there is a problem in that EL properties, i.e., the light-emitting luminance, the light-emitting efficiency, color purity, and the like, are not sufficient, and further improvements are desirable.

To obtain an organic EL element of high light-emitting efficiency, an organic EL element which has a light-emitting layer showing high light-emitting efficiency, a small amount of a pigment molecule having high fluorescence light emission properties is doped as a guest material into a host material which is the main component, is proposed in C. W. Tang, S. A. VanSlyke, and C. H. Chen, *Applied Physics Letters* vol. 65, and 3610 (1989). Example 9 in JP-A No. 11-312588 discloses tetraphenylpyrene as the guest material in 9,10-di(3',5'-o-tolyl)phenylanthracene as the host material in the aforementioned light-emitting layer. However, in this case there was almost no effect of doping the tetraphenylpyrene, and the light-emitting luminance and color purity were also insufficient.

SUMMARY OF THE INVENTION

It is therefore an object of the present invention to provide an organic EL element having excellent light-emitting efficiency, light-emitting luminance and color purity of blue light, and a highly efficient organic EL display using this organic EL element.

The organic EL element of the present invention comprises an organic thin film layer containing a light-emitting layer between an positive electrode and a negative electrode. This organic thin film layer comprises a 1,3,6,8-tetraphenylpyrene compound expressed by the following structural formula (1), and a carbazole derivative expressed by the following structural formula (2).

Structural formula (1)

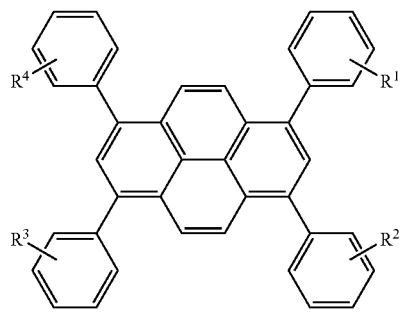

In the structural formula (1), $R^1$–$R^4$ may be identical or different, and may be a hydrogen atom or a substituent group.

Structural formula (2)

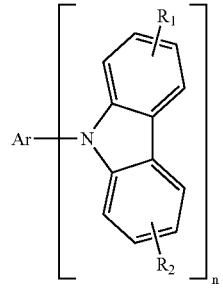

In the structural formula (2), Ar represents an aromatic group or heterocyclic group wherein $R^1$ and $R^2$ may be identical or different, may be a hydrogen atom or a substituent group, and n represents an integer.

In the organic EL element of the present invention, the organic thin film layer contains a specific 1,3,6,8-tetraphenylpyrene compound and a specific carbazole derivative, hence it excels in light-emitting efficiency, light-emitting luminance and color purity of blue light.

As the organic EL element of the present invention is used for the organic EL display of the present invention, the display also has excellent light-emitting efficiency, light-emitting luminance and color purity of blue light.

DESCRIPTION OF THE PREFERRED EMBODIMENTS

<Organic EL Element>

Figure 1:
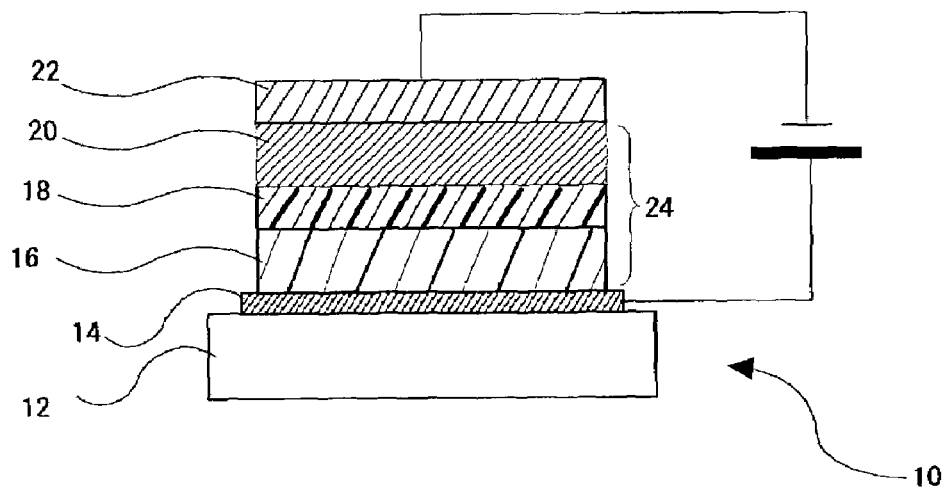
FIG. 1 is a schematic explanatory view describing an example of the layer composition in an organic EL element according to the present invention.

The organic EL element of the present invention has an organic thin film layer which contains a light-emitting layer between an positive electrode and a negative electrode, this organic thin film layer comprising at least a 1,3,6,8-tetraphenylpyrene compound expressed by the following structural formula (1), and a carbazole derivative expressed by the following structural formula (2).

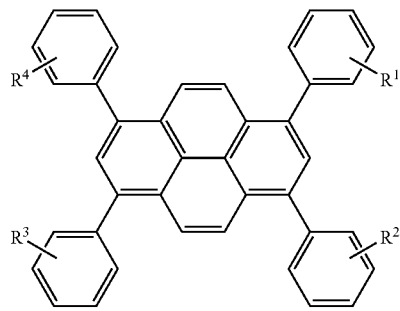

Structural formula (1)

In the structural formula (1), $R^1$ to $R^4$ may be identical or different, and represent a hydrogen atom or a substituent group. As the substituent group, an alkyl group, cycloalkyl group or aryl group may suitably be mentioned, and these may be further replaced by substituent groups.

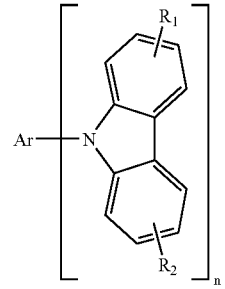

Structural formula (2)

In the structural formula (2), Ar represents a polyfunctional aromatic group or heterocyclic aromatic group, and the following bifunctional or trifunctional aromatic groups or heterocyclic aromatic groups expressed may be particularly suitably mentioned.

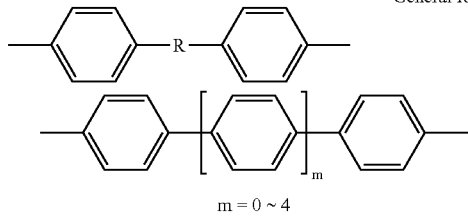

General formula (1)

m = 0 ~ 4

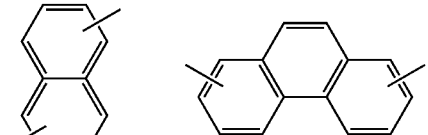

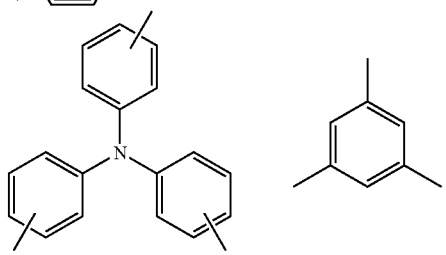

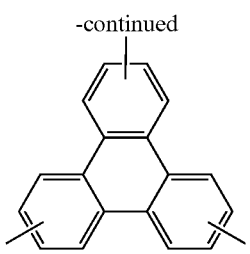

These may be substituted by non-conjugated groups. R represents a linking group, for example the following:

Chemical formula (1)

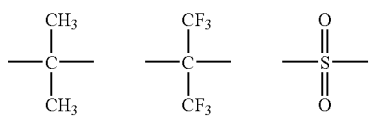

In the aforementioned structural formula (2), $R^1$ and $R^2$ may be identical or different, and may be a hydrogen atom or a substituent group. Suitable examples of this substituent group are a halogen atom, an alkyl group, an alkylsulfonyl group, an aralkyl group, an alkenyl group, a hydroxyl group, a cyano group, an amine group, an amide group, an acyl group, a carboxyl group, an alkoxy group, an alkoxycarbonyl group, an aryl group, an aryloxy group, an aromatic hydrocarbon or an aromatic heterocyclic group, and the like. These may be further substituted by a substituent group. n represents an integer, 2 or 3 being particularly suitable.

In the structural formula (2), Ar is an aromatic group in which two benzene rings are joined via a single bond, $R^1$ and $R^2$ are hydrogen atoms, and n=2. 4,4'-bis(9-carbazolyl)-biphenyl (CBP) which is expressed by the following structural formula (3) is preferred due to its excellent light-emitting efficiency, light-emitting luminance, color purity of blue light, and the like.

Structural formula (3)

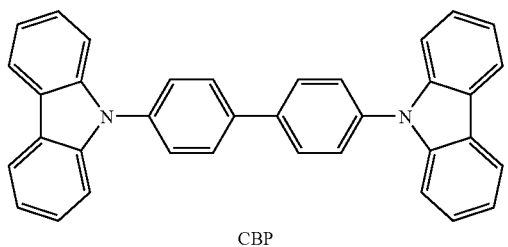

CBP

Although the above 1,3,6,8-tetraphenylpyrene compound and the aforementioned carbazole derivative are contained in the aforementioned organic thin film layer, it is preferred that they are contained in at least one of the electron transporting layer, positive hole transporting layer and light-emitting layer in this organic thin film layer, but more preferred that they are contained in the light-emitting layer.

In the aforementioned organic thin film layer or the aforementioned light-emitting layer, the above 1,3,6,8-tetraphenylpyrene compound functions as a guest material, and the aforementioned carbazole derivative functions as a host material. The optical absorption wavelength of the 1,3,6,8-tetraphenylpyrene compound is 330 nm to 400 nm, and in the aforementioned carbazole derivatives, the main light-emitting wavelength of 4,4'-bis(9-carbazolyl)-biphenyl (CBP) is 380 nm. The optical absorption wavelength of this 4,4'-bis (9-carbazolyl)-biphenyl (CBP) is shorter than that of the 1,3,6,8-tetraphenylpyrene compound, and its light-emitting wavelength is near to and overlaps with the optical absorption wavelength of the 1,3,6,8-tetraphenylpyrene compound. Thus the excitation energy moves efficiently from the excited aforementioned host material (4,4'-bis(9-carbazolyl)-biphenyl (CBP)) to the aforementioned guest material (1,3,6,8-tetraphenylpyrene compound), the host material returns to its base state without emitting light, and only the excited guest material (1,3,6,8-tetraphenylpyrene compound) emits excitation energy as blue light. This material therefore excels in light-emitting efficiency, light-emitting luminance and color purity of blue light. Further, in the aforementioned organic thin film layer or the aforementioned light-emitting layer, the 1,3,6,8-tetraphenylpyrene compound is dispersed in the aforementioned host material (4,4'-bis(9-carbazolyl)-biphenyl (CBP)) at relatively low concentration, so the above "concentration quenching" effect is effectively suppressed, and the light-emitting efficiency is excellent.

4,4'-bis(9-carbazolyl)-biphenyl (CBP) also has excellent film-forming properties so it is able to form the organic thin film layer or the light-emitting layer regardless of the film-forming properties of 1,3,6,8-tetraphenylpyrene compound itself.

The organic thin film layer or the aforementioned light-emitting layer may contain two or more types of host material unless it interferes with the effect of the present invention.

The amount of 1,3,6,8-tetraphenylpyrene compound expressed by (1) in the layer (the organic thin film layer or the light-emitting layer) containing the 1,3,6,8-tetraphenylpyrene compound is preferably 0.1% to 50% by mass, and more preferably 5% to 30% by mass.

If this content is less than 0.1% by mass, the coloring efficiency, coloring luminosity and color purity may not be sufficient, and if the content exceeds 50% by mass, the color purity may deteriorate. On the other hand, if the content is within the above preferred range, coloring efficiency, coloring luminosity and color purity are excellent. In general, when the amount of guest material increases, "concentration quenching" tends to easily occur, but according to the present invention, by using it together with a specific host material, "concentration quenching" does not occur even if the guest material content increases.

In the aforementioned light-emitting layer in the organic EL element of the present invention, a positive hole can be introduced from the positive electrode, positive hole injecting layer or positive hole transporting layer, or electrons introduced from the negative electrode, electron implantation layer or electron transporting layer while applying an electric field. An area may be provided for recombination between holes and electrons, and the 1,3,6,8-tetraphenylpyrene compound (light-emitting molecule) made to emit blue light due to the recombination energy produced at this time. In addition to the 1,3,6,8-tetraphenylpyrene compound, other light-emitting materials may be added to the extent that they do not interfere with the blue light emission.

The aforementioned light-emitting layer can be formed according to the known methods, for example, the vapor deposition method, wet film forming method, MBE (molecular beam epitaxy) method, cluster ion beam method, molecule laminating method, LB method, printing method, transfer method, and the like.

Of these, vapor deposition is preferred from the viewpoint that an organic solvent is not used so there is no problem of waste fluid treatment, and manufacture is low cost, simple and efficient. In designing the light-emitting layer as a single layer structure, when for example forming this light-emitting layer as a positive hole transporting layer/light-emitting layer/electron transporting layer, the wet film forming method is preferred.

There is no particular limitation on the vapor deposition method, which can be suitably selected from known methods according to the purpose, for example vacuum vapor deposition, resistance heating vapor deposition, chemical vapor deposition, physical vapor deposition, and the like. Examples of chemical vapor deposition are plasma CVD, laser CVD, heat CVD and gas source CV.

The 1,3,6,8-tetraphenylpyrene compound may suitably be formed by vacuum vapor deposition, or in the case where this light-emitting layer contains the aforementioned host material in addition to the above 1,3,6,8-tetraphenylpyrene compound, the 1,3,6,8-tetraphenylpyrene compound and this host material can be formed simultaneously by vacuum vapor deposition.

There is no particular limitation on the aforementioned wet film forming method which can be suitably selected from known methods according to the purpose, for example the ink-jet method, spin coat method, kneader coat method, bar coat method, braid coat method, cast method, dip method, curtain coat method, and the like.

In the aforementioned wet film forming method, a solution may be used (coated) in which the material of the light-emitting layer is dissolved or dispersed together with a resin component. Examples of this resin component are polyvinyl carbazole, polycarbonate, polyvinyl chloride, polystyrene, polymethyl methacrylate, polyester, polysulfone, polyphenylene oxide, polybutadiene, hydrocarbon resins, ketone resin, phenoxy resin, polyamide, ethyl cellulose, vinyl acetate, ABS resin, polyurethane, melamine resin, unsaturated polyester resin, alkyde resin, epoxy resin, silicone resin, and the like.

The light-emitting layer obtained by the wet film forming method may be formed for example by using (coating and drying) a solution (coating liquid) in which the 1,3,6,8-tetraphenylpyrene compound, and a resin material if necessary, are dissolved in a solvent, or if this light-emitting layer contains the aforementioned host material in addition to the 1,3,6,8-tetraphenylpyrene compound, by using (coating and drying) a solution (coating liquid) in which this 1,3,6,8-tetraphenylpyrene compound, the host material and a resin material if necessary are dissolved in a solvent.

The thickness of the aforementioned light-emitting layer is preferably 1 nm to 50 nm, but more preferably 3 nm to 20 nm.

If the thickness of the light-emitting layer is within the above preferred numerical range, light-emitting efficiency, light-emitting luminance and color purity of the blue light emitted by this organic EL element are sufficient, and if it is within the more preferred numerical range, these effects are more pronounced.

The organic EL element of the present invention comprises an organic thin film layer containing a light-emitting layer interposed between a positive electrode and a negative electrode, but it may have other layers such as a protective layer, according to the purpose.

The organic thin film layer comprises at least the aforementioned light-emitting layer, and may also have a positive hole injecting layer, a positive hole transporting layer, a positive hole blocking layer or an electron transporting layer as necessary.

Positive Electrode

There is no particular limitation on the positive electrode, which can be suitably selected according to the purpose. Specifically, when this organic thin film layer comprises only the light-emitting layer, it is preferred to supply positive holes (carrier) to this light-emitting layer; when this organic thin film layer further comprises a positive hole transporting layer, it is preferred to supply positive holes (carrier) to this positive hole transporting layer; and when this organic thin film layer further comprises a positive hole injecting layer, it is preferred to supply positive holes (carrier) to this positive hole injecting layer.

There is no particular limitation on the material of the positive electrode. It can be suitably selected according to the purpose, for example metals, alloys, metal oxides, electrically conducting compounds, mixtures thereof, and the like. Materials having a work function of 4 eV or more are preferred.

Specific examples of the material of the positive electrode are electrically conducting metal oxides such as tin oxide, zinc oxide, indium oxide, indium tin oxide (ITO), and the like, metals such as gold, silver, chromium, nickel, and the like, mixtures or laminates of these metals and electrically conducting metal oxides, inorganic electrically conducting substances such as copper iodide, copper sulfide, and the like, organic electrically conducting materials such as polyaniline, polythiophene, polypyrrole, and the like, and laminates of these with ITO, and the like. These may be used either alone or in combination of two or more. Of these, electrically conducting metal oxides are preferred, and ITO is particularly preferred from the viewpoints of productivity, high conductivity and transparency.

There is no particular restriction on the thickness of the positive electrode which may be selected according to the material, but 1 nm to 5000 nm is preferred and 20 nm to 200 nm is more preferred.

The positive electrode is normally formed on a substrate such as a glass like soda lime glass or non-alkali glass, or a transparent resin.

When using the above-mentioned glass as the substrate, non-alkali glass or soda lime glass with a barrier coat of silica or the like, are preferred from the viewpoint that they lessen elution ions from the glass.

There is no particular limitation on the thickness of the substrate provided that it is sufficient to maintain mechanical strength, but when using glass as the substrate, it is normally 0.2 mm or more, and 0.7 mm or more is preferred.

The positive electrode can be suitably formed by any of the methods mentioned above, such as the method of applying a dispersion of ITO by the vapor deposition method, the wet film forming method, the electron beam method, the sputtering method, the reactant sputtering method, the MBE (molecular beam epitaxy) method, the cluster ion beam method, the ion plating method, the plasma polymerization method (high frequency excitation ion plating method), the molecule laminating method, the LB method, the printing method, the transfer method, the chemical reaction methods (sol gel process, for example.), and the like.

By washing the positive electrode and performing other treatment, the drive voltage of this organic EL element can be reduced, and the light-emitting efficiency can also be increased. As examples of other treatment, when the material of the positive electrode is ITO, UV ozonization and plasma processing, and the like, may be mentioned.

Negative Electrode

There is no particular limitation on the negative electrode, which can be suitably selected according to the purpose. Specifically, when this organic thin film layer comprises only the light-emitting layer, it is preferred to supply electrons to this light-emitting layer; when this organic thin film layer further comprises an electron transporting layer, it is preferred to supply electrons to this electron transporting layer; and when there is an electron implantation layer between this organic thin film layer and the negative electrode, it is preferred to supply electrons to this electron implantation layer.

There is no particular limitation on the material of the negative electrode which can be suitably selected according to adhesion properties with the layers or molecules adjoining this negative electrode, such as the electron transporting layer and light-emitting layer, and according to ionization potential, and stability. Examples are metals, alloys, metal oxides, electrically conducting compounds, mixtures thereof, and the like.

Examples of the material of the negative electrode are alkali metals (e.g., Li, Na, K, Cs, and the like), alkaline earth metals (e.g., Mg, Ca, and the like), gold, silver, lead, aluminum, sodium-potassium alloys or their mixtures, lithium-aluminium alloys or their mixtures, magnesium-silver alloys or their mixtures, rare earth metals such as indium, ytterbium and the like, and their alloys, and the like.

One of these may be used alone, or two or more may be used in combination. Of these, materials having a work function of 4 eV or less are preferred. Aluminum, lithium-aluminium alloys or their mixtures, or magnesium-silver alloys or their mixtures, and the like are more preferred.

There is no particular limitation on the thickness of the negative electrode which may be selected according to the material of the negative electrode, but 1 nm to 10000 nm is preferred and 20 nm to 200 nm is more preferred.

The negative electrode can be suitably formed by any of the methods mentioned above, such as the vapor deposition method, the wet film forming method, the electron beam method, the sputtering method, the reactant sputtering method, the MBE (molecular beam epitaxy) method, the cluster ion beam method, the ion plating method, the plasma polymerization method (high frequency excitation ion plating method), the molecule laminating method, the LB method, the printing method, the transfer method, and the like.

When two or more of these are used together as the material of the negative electrode, two or more materials may be vapor-deposited simultaneously to form an alloy electrode, or a pre-prepared alloy may be made to vapor-deposit so as to form an alloy electrode.

The resistances of the positive electrode and negative electrode are preferably low, and it is preferred that they are several hundreds of Ω/□ or less.

Positive Hole Injecting Layer

There is no particular restriction on the positive hole injecting layer which can be selected according to the purpose, but it is preferred that it has the function of, for example, implanting positive holes from the positive electrode when an electric field is applied.

There is no particular limitation on the material of the positive hole injecting layer which can be suitably selected according to the purpose, e.g. a starburst amine (4,4',4"-tris[3-methylphenyl(phenyl)amino]triphenylamine:m-MT-DATA) expressed by the following structural formula (4), copper phthalocyanin, polyaniline, and the like.

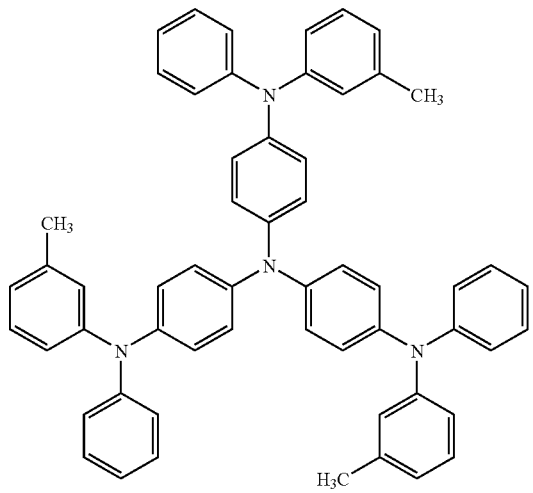

Structural formula (4)

There is no particular limitation on the thickness of the positive hole injecting layer which can be selected according to the purpose. For example, about 1 nm to 100 nm is preferred, and 5 nm to 50 nm is more preferred.

The positive hole injecting layer can be suitably formed by any of the methods mentioned above, such as the vapor deposition method, the wet film forming method, the electron beam method, the sputtering method, the reactant sputtering method, the MBE (molecular beam epitaxy) method, the cluster ion beam method, the ion plating method, the plasma polymerization method (high frequency excitation ion plating method), the molecule laminating method, the LB method, the printing method, the transfer method, and the like.

Positive Hole Transporting Layer

There is no particular limitation on the positive hole transporting layer which can be selected according to the purpose, but for example, a layer having the function to convey positive holes from the positive electrode when an electric field is applied, is preferred.

There is no particular limitation on the material of the positive hole transporting layer which can suitably be selected according to the purpose. Examples are aromatic amine compounds, carbazole, imidazole, triazole, oxazole, oxadiazole, polyarylalkane, pyrrazoline, pyrrazolone, phenylene diamine, arylamine, amine-substituted calcone, stylyl anthracene, fluorenone, hydrazone, stylbene, silazane, stylyl amine, aromatic dimethylidene compounds, porphyrine compounds, polisilane compounds, poly(N-vinyl carbazole), aniline copolymers, electrically conducting oligomers and polymers such as thiophene oligomers and polymers, polythiophene and carbon film.

These may be used alone, or two or more may be used in combination. Of these, aromatic amine compounds are preferred. Specifically, TPD (N,N'-diphenyl-N,N'-bis(3-methylphenyl)-[1,1'-biphenyl]-4,4'-diamine) expressed by the following structural formula (5), and NPD (N,N'-dinaphthyl-N,N'-diphenyl-[1,1'-biphenyl]-4,4'-diamine) expressed by the following structural formula (6), are more preferred.

Structural formula (5)

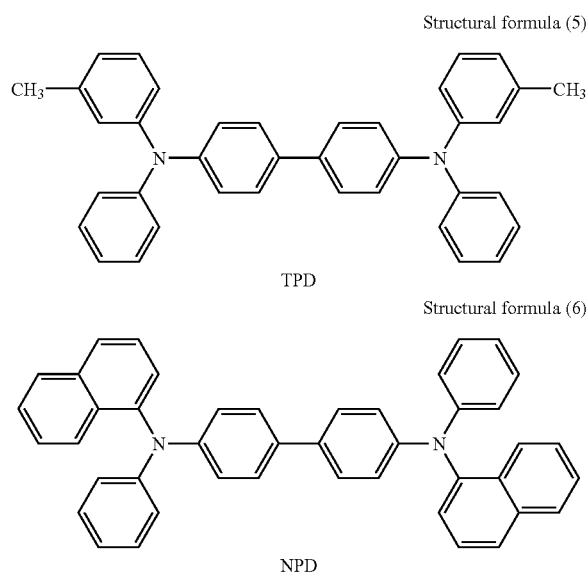

TPD

Structural formula (6)

NPD

There is no particular limitation on the thickness of the positive hole transporting layer which may be selected according to the purpose, but normally 1 nm to 500 nm is preferred, and 10 nm to 100 nm is more preferred.

The positive hole transporting layer can be suitably formed by any of the methods mentioned above, such as the vapor deposition method, the wet film forming method, the electron beam method, the sputtering method, the reactant sputtering method, the MBE (molecular beam epitaxy) method, the cluster ion beam method, the ion plating method, the plasma polymerization method (high frequency excitation ion plating method), the molecule laminating method, the LB method, the printing method, the transfer method, and the like.

Positive Hole Blocking Layer

There is no particular limitation on the positive hole blocking layer which may be selected according to the purpose, but a layer having for example the function of a barrier to positive holes implanted from the positive electrode, is preferred.

There is no particular limitation on the material of the positive hole blocking layer which can be suitably selected according to the purpose, for example, 9-dimethyl-4,7-diphenyl-1,10-phenanthroline (bathocuproin; BCP), and the like expressed by the following structural formula (7).

Structural formula (7)

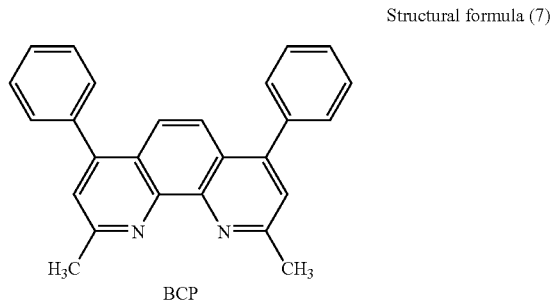

BCP

If the aforementioned organic EL element comprises a positive hole blocking layer, positive holes conveyed from the positive electrode side are blocked by this positive hole blocking layer, and electrons conveyed from the negative electrode are transmitted through this positive hole blocking layer to reach the aforementioned light-emitting layer. Hence, recombination of electrons and positive holes occurs efficiently in this light-emitting layer, and recombination of positive holes and electrons in organic thin film layers other than this light-emitting layer can be prevented. Thus, the luminescence from the 1,3,6,8-tetraphenylpyrene compound which is the target luminescent material is obtained efficiently, and this is advantageous in respect of color purity.

The positive hole blocking layer is preferably disposed between the light-emitting layer and the electron transporting layer.

There is no particular limitation on the thickness of the positive hole blocking layer which can be suitably selected according to the purpose, for example it is usually about 1 nm to 500 nm, but 10 nm to 50 nm is preferred.

The positive hole blocking layer may be a single layer structure, or may be a laminated structure.

The positive hole blocking layer can be suitably formed by any of the methods mentioned above such as the vapor deposition method, the wet film forming method, the electron beam method, the sputtering method, the reactant sputtering method, the MBE (molecular beam epitaxy) method, the cluster ion beam method, the ion plating method, the plasma polymerization method (high frequency excitation ion plating method), the molecule laminating method, the LB method, printing method, the transfer method, and the like.

Electron Transporting Layer

There is no particular limitation on the electron transporting layer which may suitably be selected according to the purpose, but for example a layer having the function to convey electrons from the negative electrode, or the function to act as a barrier to positive holes implanted from the positive electrode, is preferred.

Examples of the material of the electron transporting layer are quinoline derivatives, for example organic metal complexes having an 8-quinoline such as tris (8-quinolinolite) aluminum (Alq) expressed by the following structural formula (8) or a derivative thereof as ligand, oxadiazole derivative, triazole derivative, phenanthroline derivative, perylene derivative, pyridine derivative, pyrimidine derivative, quinoxaline derivative, diphenylquinone derivative, nitrosubstituted fluorophene derivative, and the like.

Aluminum Quinoline Complex (Alq)

Structural formula (8)

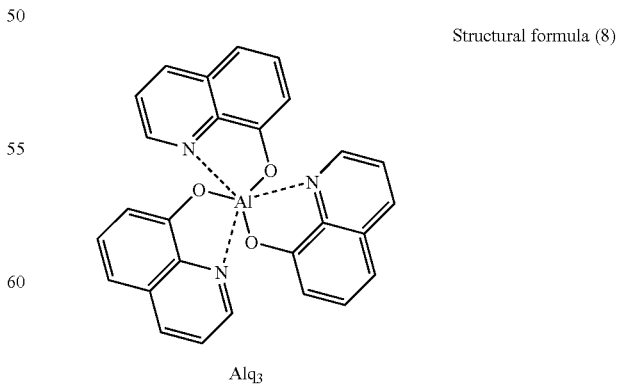

Alq₃

There is no particular limitation on the thickness of the electron transporting layer which can be suitably selected according to the purpose, for example it is usually about 1 nm to 500 nm, but preferably 10 nm to 50 nm.

The electron transporting layer may be a single layer structure, or may be a laminated structure.

The electron transporting layer can be suitably formed by any of the methods mentioned above, such as the vapor deposition method, the wet film forming method, the electron beam method, the sputtering method, the reactant sputtering method, the MBE (molecular beam epitaxy) method, the cluster ion beam method, the ion plating method, the plasma polymerization method (high frequency excitation ion plating method), the molecule laminating method, the LB method, the printing method, the transfer method, and the like.

Other Layers

An organic EL element of the present invention may have other layers which are suitably selected according to the purpose, for example, a protective layer, and the like.

There is no particular limitation on the aforementioned protection layer which may be suitably selected according to the purpose, but for example a layer which can prevent molecules or substances which promote deterioration of the organic EL element, such as moisture and oxygen, from penetrating the organic EL element, is preferred.

Examples of the material of the aforementioned protection layer are metals such as In, Sn, Pb, Au, Cu, Ag, Al, Ti, Ni, and the like, metal oxides such as MgO, SiO, $SiO_2$, $Al_2O_3$, GeO, NiO, CaO, BaO, $Fe_2O_3$, $Y_2O_3$, $TiO_2$, and the like, nitrides such as SiN, $SiN_xO_y$, and the like, metal fluorides such as $MgF_2$, LiF, $AlF_3$, $CaF_2$, polyethylene, polypropylene, polymethyl methacrylate, polyimide, polyurea, polytetrafluoroethylene, polychlorotrifluoroethylene, polydichlorodifluoroethylene, the copolymer of chlorotrifluoroethylene and dichlorodifluoroethylene, copolymers obtained by copolymerizing a monomer mixture comprising tetrafluoroethylene and at least one comonomer, fluorine-containing copolymers having a ring structure in the copolymer main chain, water-absorbing substances having a water absorption rate of 1% or more, and dampproof substances having a water absorption rate of 0.1% or less.

The aforementioned protection layer can be suitably formed by any of the methods mentioned above such as the vapor deposition method, the wet film forming method, the sputtering method, the reactant sputtering method, the MBE (molecular beam epitaxy) method, the cluster ion beam method, the ion plating method, the plasma polymerization method (high frequency excitation ion plating method), the printing method, the transfer method, and the like.

There is no particular limitation on the structure of the organic EL element of the present invention which may be selected according to the purpose, i.e., the following layer compositions (1)–(13):

(1) Positive electrode/positive hole injecting layer/positive hole transporting layer/light-emitting layer/electron transporting layer/electron implantation layer/negative electrode, (2) Positive electrode/positive hole injecting layer/positive hole transporting layer/light-emitting layer/electron transporting layer/negative electrode, (3) Positive electrode/positive hole transporting layer/light-emitting layer/electron transporting layer/electron implantation layer/negative electrode, (4) Positive electrode/positive hole transporting layer/light-emitting layer/electron transporting layer/negative electrode, (5) Positive electrode/positive hole injecting layer/positive hole transporting layer/light-emitting and layer-electron transporting layer/electron implantation layer/negative electrode (6) Positive electrode/positive hole injecting layer/positive hole transporting layer/light-emitting layer-electron transporting layer/negative electrode, (7) Positive electrode/positive hole transporting layer/light-emitting and layer-electron transporting layer/electron implantation layer/negative electrode, (8) Positive electrode/positive hole transporting layer/light-emitting and layer-electron transporting layer/negative electrode, (9) Positive electrode/positive hole injecting layer/positive hole transport and light-emitting layer/electron transporting layer/electron implantation layer/negative electrode

(10) Positive electrode/positive hole injecting layer/positive hole transport and light-emitting layer/electron transporting layer/negative electrode,

(11) Positive electrode/positive hole transport and light-emitting layer/electron transporting layer/electron implantation layer/negative electrode,

(12) Positive electrode/positive hole transport and light-emitting layer/electron transporting layer/negative electrode,

(13) Positive electrode/positive hole transport and light-emitting and electron transporting layer/negative electrode, and the like.

When the organic EL element has a positive hole blocking layer, a layer configuration in which the positive hole blocking layer is interposed between the light-emitting layer and electron transporting layer in the configuration (1) to (13) presented above may also be suitable.

Of these layer compositions, the aspect (4), positive electrode/positive hole transporting layer/light-emitting layer/electron transporting layer/negative electrode, is shown in FIG. 1. An organic EL element 10 has a layer composition comprising an positive electrode 14 (for example, ITO electrode) formed on a glass substrate 12, a positive hole transporting layer 16, a light-emitting layer 18, an electron transporting layer 20, and a negative electrode 22 (for example, Al—Li electrode) laminated in this order. The positive electrode 14 (for example, ITO electrode) and the negative electrode 22 (for example, Al—Li electrode) are interconnected through the power supply. An organic thin film layer 24 which emits blue light is formed by the positive hole transporting layer 16, light-emitting layer 18 and electron transporting layer 20.

Figure 2:
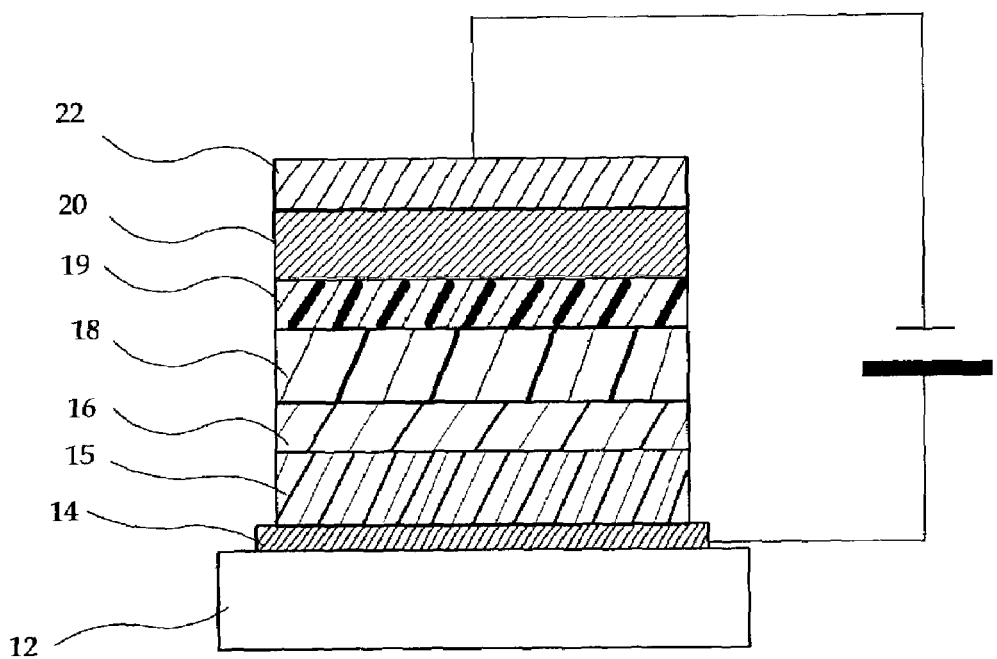
FIG. 2 is a schematic explanatory view describing another example of the layer composition in an organic EL element according to the present invention.

An aspect in which the layer composition comprises the positive hole blocking layer is shown in FIG. 2. This organic EL element has a layer composition in which an ITO electrode (positive electrode) 14 formed on the glass substrate 12, a positive hole injecting layer 15, a positive hole transporting layer 16, a light-emitting layer 18, a positive hole blocking layer 19, an electron transporting layer 20, and an Al—Li electrode (negative electrode) 22 are laminated in this order. The ITO electrode and the Al—Li electrode are interconnected through the power supply. An organic thin film layer which emits blue light is formed by the positive hole injecting layer, positive hole transporting layer, light-emitting layer, positive hole blocking layer and electron transporting layer.

As the color emission wavelength of the organic EL element of the present invention, 400 nm to 500 nm is preferred.

As a CIE color coordinates of the EL light emission in the organic EL element of the present invention, when the y value is reduced, the color purity becomes better, and y preferably satisfies the condition y<0.12.

From the viewpoint of light-emitting efficiency of the organic EL element of the present invention, it is preferred that it emits blue light at a voltage of 10V or less, more preferred that it emits blue light at a voltage of 7V or less, and still more preferred that it emits blue light at a voltage of 5V or less.

It is preferred that, at an applied voltage of 10V, the light-emitting luminance of the organic EL element of the present invention is 100 cd/m$^2$ or more, more preferred that it is 500 cd/m$^2$ or more, and particularly preferred that it is 1000 cd/m$^2$ or more.

The organic EL element of the present invention is especially useful in various fields such as computers, display devices for vehicle mounting, field display devices, home apparatuses, industrial apparatus, household electric appliances, traffic display devices, clock display devices, calendar display units, luminescent screens and audio equipment, and is particularly suitable for the organic EL display of the present invention described hereinafter.

<Organic EL Display>

Other than utilizing the organic EL element of the present invention, the organic EL display of the present invention is not particularly limited, and may be selected from the known compositions.

The organic EL display may emit blue monochrome light, multi-color light, or a full color type.

The organic EL display may be formed as a full color type as disclosed in *Japan Display Monthly*, September 2000, pages 33 to 37, i.e., a method for emitting lights in three colors in which the light emitting organic EL elements respectively corresponds to the three primary colors (blue (B), green (G), red (R)) are disposed on a substrate, the white method wherein the white light from an organic EL element for white light emission is divided into the three primary colors by color filters, and the color conversion method wherein a blue light emitted by an organic EL element which emits blue light is converted into red (R) and green (G) by a fluorescent pigment layer. In the present invention, as the organic EL element of the invention emits blue light, the three color light emitting method and color conversion method can be used, the three color light emitting method being particularly suitable.

In manufacturing the full color organic EL display by the aforementioned three color light emitting method, an organic EL element for red light emission and organic EL element for green light emission are required in addition to the organic EL element for blue light emission of the present invention.

There is no particular limitation on the organic EL element for red light emission which can be selected from those known in the art, and for example the layer composition is expressed by ITO (positive electrode)/NPD/DCJTB expressed by the following structural formula (9), 1% aluminum quinoline complex (Alq)/Alq/AL—Li (negative electrode). DCJTB is 4-dicyanomethylene-6-cp-julolidinostyryl-2-tert-butyl-4H-pyran.

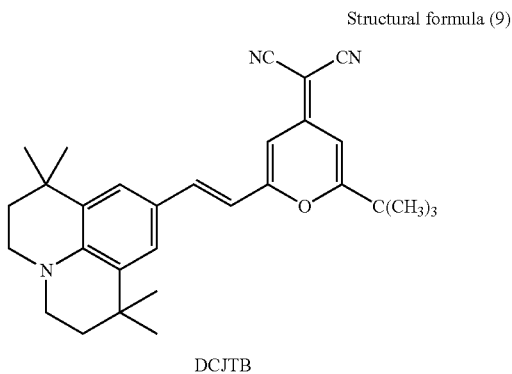

Structural formula (9)

DCJTB

There is no particular limitation on the organic EL element for green light emission which can be selected from those known in the art, and for example the layer composition may be expressed by ITO (positive electrode)/NPD/dimethyl quinacridon 1% Alq/Alq/AL—Li (negative electrode).

There is no particular limitation on the organic EL display which may be selected according to the purpose, but the passive matrix panel and active matrix panel disclosed by *Nikkei Electronics*, No. 765, Mar. 13, 2000, pages 55 to 62 are suitable.

Figure 3:
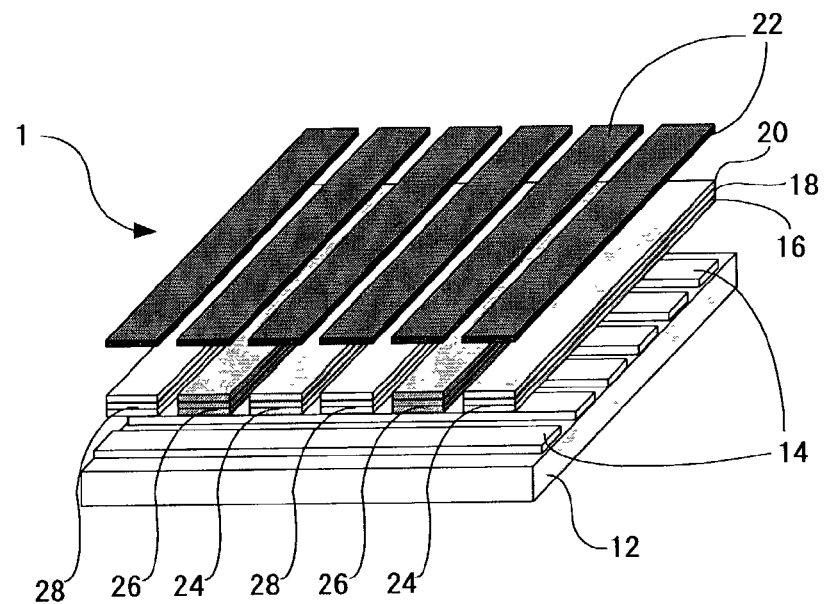
FIG. 3 is a schematic explanatory view describing an example of the construction of an organic EL display (passive matrix panel) of a passive matrix method.

The aforementioned passive matrix panel for example has belt-like positive electrodes 14 (for example, ITO electrodes) arranged parallel to each other on a glass substrate 12. A belt-like organic thin film layer 24 for blue light emission, organic thin film layer 26 for green light emission and organic thin film layer 28 for red light emission are arranged sequentially in parallel and effectively perpendicular to the positive electrode 14 on the positive electrode 14, as shown in FIG. 3. This has negative electrodes 22 of identical shape on the organic thin film layer 24 for blue light-emission, the organic thin film layer 26 for green light emission, and the organic thin film layer 28 for red light emission.

Figure 4:
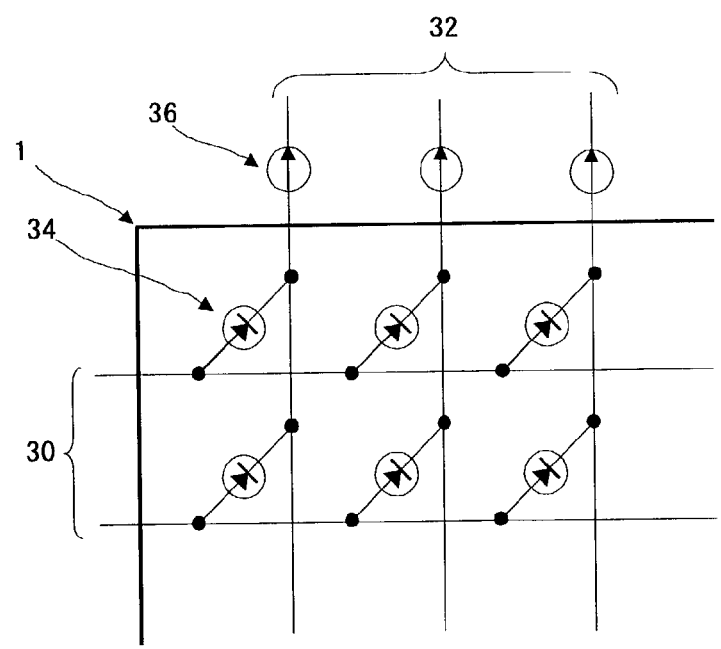
FIG. 4 is a schematic explanatory view describing an example of the circuit in an organic EL display (passive matrix panel) of the passive matrix method shown in FIG. 3.

In the aforementioned passive matrix panel, positive electrode lines 30 comprising plural positive electrodes 14, and negative electrode lines 32 comprising plural negative electrodes 22, for example intersect effectively at right angles to form a circuit, as shown in FIG. 4. Each of the organic thin film layers 24, 26, 28 for blue light emission, green light emission and red light emission situated at each intersection point functions as a pixel, there being plural organic EL elements 34 corresponding to each pixel. In this passive matrix panel, when a current is applied by a constant current source 36 to one of the positive electrodes 14 in the positive electrode lines 30, and one of the negative electrodes 22 in the negative electrode lines 32, a current will be applied to the organic EL thin film layer situated at the intersection, and the organic EL thin film layer at this position will emit light. By controlling the light emission of this pixel unit, a full color picture can easily be formed.

Figure 5:
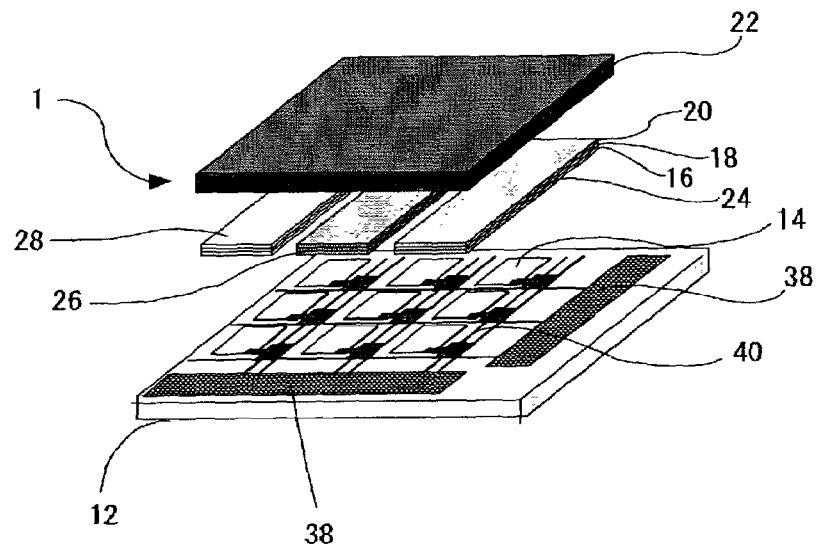
FIG. 5 is a schematic explanatory view describing an example of the construction of an organic EL display (active matrix panel) of an active matrix method.

In the active matrix panel, for example, scanning lines, data lines and current supply lines are arranged in a grid pattern on the glass substrate 12, as shown in FIG. 5. A TFT circuit 40 connected by the scanning lines forming the grid pattern is disposed in each square, and an positive electrode 14 (for example, ITO electrode) disposed in each square can be driven by the TFT circuit 40. The belt-like organic thin film layer 24 for blue light emission, organic thin film layer 26 for green light emission and organic thin film layer 28 for red light emission, are arranged sequentially in parallel. The negative electrodes 22 are also arranged so as to cover the organic thin film layer 24 for blue light emission, organic thin film layer 26 for green light emission and organic thin film layer 28 for red light emission. The organic thin film layer 24 for blue light emission, organic thin film layer 26 for green light emission and organic thin film layer 28 for red light emission respectively form a positive hole transporting layer 16, light-emitting layer 18 and electron transporting layer 20.

Figure 6:
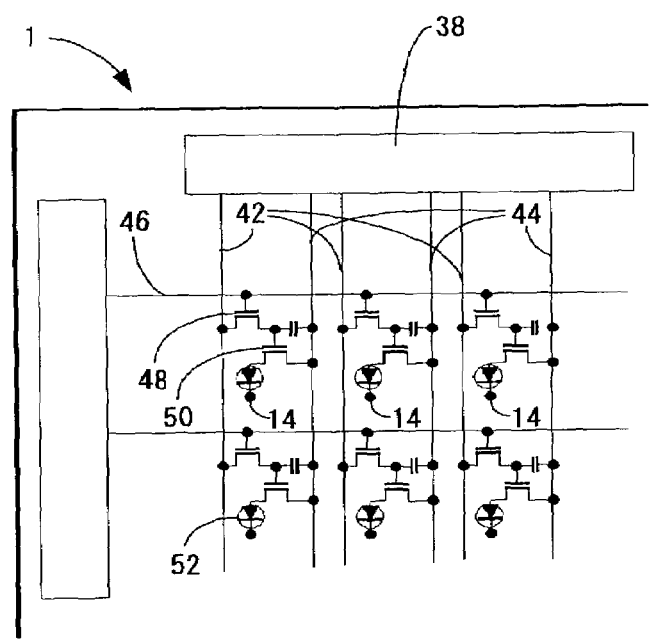
FIG. 6 is a schematic explanatory view describing an example of the circuit in an organic EL display (active matrix panel) of the active matrix method shown in FIG. 5.

In the aforementioned active matrix panel, plural scanning lines 46 parallel to each other, plural data lines 42 parallel to each other and current supply lines 44 intersect effectively at right angles to form squares, as shown in FIG. 6, and a switching TFT 48 and drive TFT 50 are connected to each square to form a circuit. If an electric current is applied from a drive circuit 38, the switching TFT 48 and drive TFT 50 can be driven for each square. In each square, the organic thin film elements 24, 26, 28 for blue light emission, green light emission and red light emission function as a pixel. In this active matrix panel, if a current is applied from the drive circuit 38 to one of the scanning lines 46 arranged in the horizontal direction, and the current supply line 44 arranged in the vertical direction, the switching TFT 48 situated at the intersection is driven, the drive TFT 50 is driven as a result, and the organic EL element 52 at this position emits light. By controlling the light emission of this pixel unit, a full color picture can easily be formed.

Figure 7:
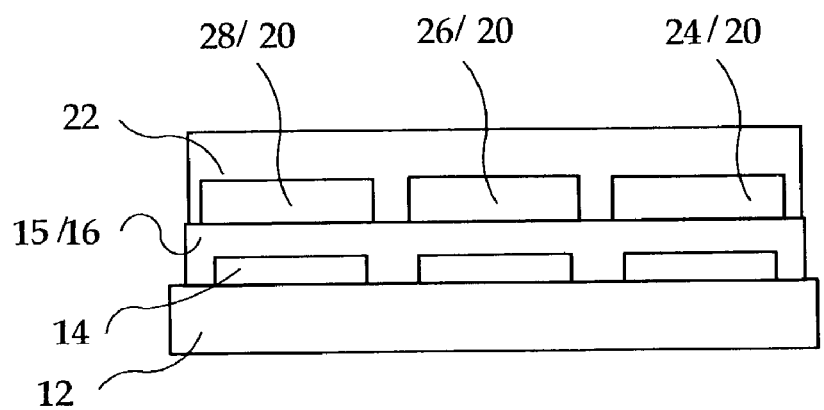
FIG. 7 is a schematic explanatory view describing an example of an organic EL display according to an aspect wherein a positive hole injecting layer and a positive hole transporting layer are shared between the organic EL elements of each color.

In the present invention, a structure is preferred in which the positive hole transporting layer 16 (as well as the positive hole injecting layer 15) in FIGS. 3 and 5 is not patterned, and is common to the organic thin film layer 24 for blue light emission, the organic thin film layer 26 for green light emission and the organic thin film layer 28 for red light emission, as shown in FIG. 7. In the case of this structure, patterning of the positive hole transporting layer 16 (as well as the positive hole injecting layer 15) is unnecessary, manufacture is easy and short circuits of the positive electrodes and negative electrodes can be prevented.

The organic EL display of the present invention may be suitably used in fields of various kinds such as computers, vehicle-mounted display devices, field display devices, home apparatus, industrial apparatus, household electric appliances, traffic display devices, clock display devices, calendar display units, luminescent screens and audio equipment.

Hereinafter, specific examples of the present invention will be described in detail, but it should be understood that the present invention is not limited to these examples.

EXAMPLE 1

An organic EL element of the laminated type using 1,3,6,8-tetraphenylpyrene and 4,4'-bis(9-carbazolyl)-biphenyl (CBP) for the light-emitting layer was manufactured as follows. A glass substrate on which an ITO electrode was formed as an positive electrode was ultrasonically cleaned using water, acetone and isopropyl alcohol. After UV ozonization, using a vacuum vapor deposition device (degree of vacuum=$1\times10^{-6}$ Torr ($1.3\times10^{-4}$ Pa), substrate-temperature=room temperature), m-MTDATA was formed as a positive hole injecting layer to cover this ITO electrode to a thickness of 30 nm. Next NPD, which is a positive hole transporting layer, was coated on the m-MTDATA positive hole injecting layer to a thickness of 20 nm. Next, a light-emitting layer of thickness 30 nm was coated on the above NPD positive hole transporting layer by simultaneous vapor deposition, so that the 1,3,6,8-tetraphenylpyrene and 4,4'-bis(9-carbazolyl)-biphenyl (CBP) formed 90 molecules of CBP (90 mols, 90% by mass) relative to 10 molecules of 1,3,6,8-tetraphenylpyrene (10 mols, 10% by mass). BCP was then formed as a positive hole blocking layer on this light-emitting layer to a thickness of 10 nm. Alq was then coated as an electron transporting layer on this positive hole blocking layer to a thickness of 20 nm, and Al—Li alloy (Li content=0.5% by mass) was vapor deposited on this Alq electron transporting layer as a negative electrode to a thickness of 80 nm. The organic EL element was manufactured by the above process.

Figure 8:
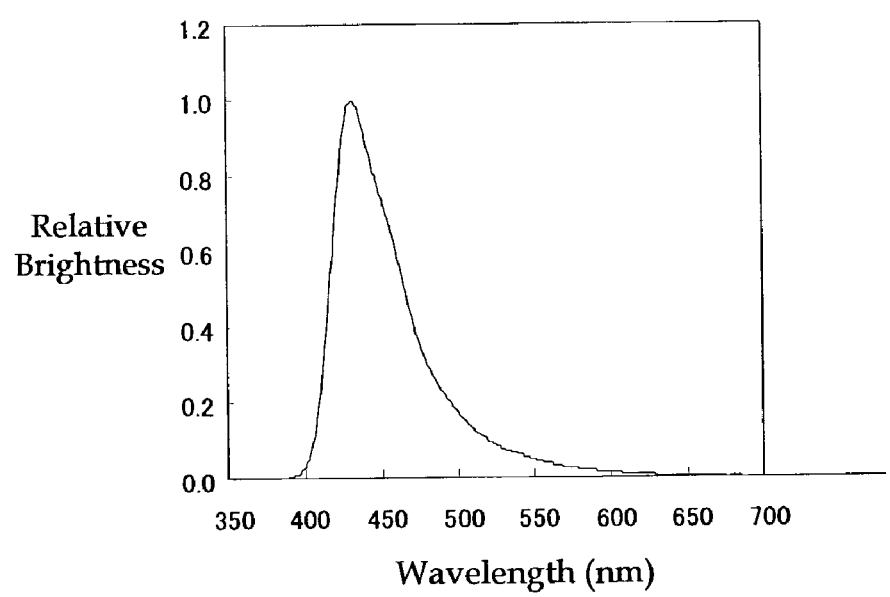
FIG. 8 is a graph showing an example of the light emission spectrum of the organic EL element of Example 1.

When a voltage was applied to the ITO electrode (positive electrode) and Al—Li alloy (negative electrode) in the manufactured organic EL element, in this organic EL element, a blue light emission was observed at a voltage of 4V or higher, and at an applied voltage of 10V, a high purity blue light emission of light-emitting luminance 2100 cd/m$^2$ (CIE color coordinates of EL light emission: x=0.162, y=0.082) was observed. The light emission spectrum from this organic EL element was an identical light emission spectrum to the original light-emitting spectrum of 1,3,6,8-tetraphenylpyrene, which is the guest material, as shown in FIG. 8.

EXAMPLE 2

An organic EL element was manufactured as in Example 1, except that the vapor deposition ratio of 1,3,6,8-tetraphenylpyrene and 4,4'-bis(9-carbazolyl)-biphenyl (CBP) was 99 molecules of CBP (99 mols, 99% by mass) relative to one molecule of 1,3,6,8-tetraphenylpyrene (1 mol, 1% by mass).

When a voltage was applied to the ITO electrode (positive electrode) and Al—Li alloy (negative electrode) in the manufactured organic EL element, in this organic EL element, a blue light emission was observed at a voltage of 5V or higher, and at an applied voltage of 10V, a high purity blue light emission of light-emitting luminance 850 cd/m$^2$ (CIE color coordinates of EL light emission: x=0.161, y=0.072) was observed.

EXAMPLE 3

An organic EL element was manufactured as in Example 1, except that the vapor deposition ratio of 1,3,6,8-tetraphenylpyrene and 4,4'-bis(9-carbazolyl)-biphenyl (CBP) was 95 molecules of CBP (95 mols, 95% by mass) relative to 5 molecules of 1,3,6, 8-tetraphenylpyrene (5 mol, 5% by mass).

When a voltage was applied to the ITO electrode (positive electrode) and Al—Li alloy (negative electrode) in the manufactured organic EL element, in this organic EL element, a blue light emission was observed at a voltage of 4V or higher, and at an applied voltage of 10V, a high purity blue light emission of light-emitting luminance 1580 cd/m$^2$ (CIE color coordinates of EL light emission: x=0.159, y=0.070) was observed.

EXAMPLE 4

An organic EL element was manufactured as in Example 1, except that the vapor deposition ratio of 1,3,6,8-tetraphenylpyrene and 4,4'-bis(9-carbazolyl)-biphenyl (CBP) was 80 molecules of CBP (80 mols, 80% by mass) relative to 20 molecules of 1,3,6,8-tetraphenylpyrene (20 mol, 20% by mass).

When a voltage was applied to the ITO electrode (positive electrode) and Al—Li alloy (negative electrode) in the manufactured organic EL element, in this organic EL element, a blue light emission was observed at a voltage of 4V or higher, and at an applied voltage of 10V, a high purity blue light emission of light-emitting luminance 2630 cd/m² (CIE color coordinates of EL light emission: x=0.163, y=0.098) was observed.

Hereinafter comparative Examples are presented to better support the features of the present invention.

COMPARATIVE EXAMPLE 1

An organic EL element was manufactured as in Example 2, except that 4,4'-bis(9-carbazolyl)-biphenyl (CBP) was replaced by the above NPD, a positive hole transporting layer was not provided, and the light-emitting layer was used as a positive hole transport and light-emitting layer.

Figure 9:
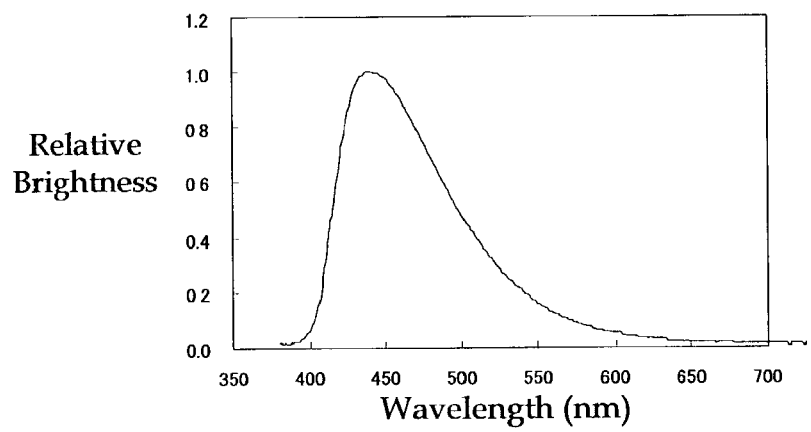
FIG. 9 is a graph showing an example of the light emission spectrum of the organic EL element of Comparative Example 1.

When a voltage was applied to the ITO electrode (positive electrode) and Al—Li alloy (negative electrode) in the manufactured organic EL element, in this organic EL element, a blue light emission was observed at a voltage of 5V or higher, and at an applied voltage of 10V, a high purity blue light emission of light-emitting luminance 650 cd/m² (CIE color coordinates of EL light emission: x=0.168, y=0.152) was observed. The light emission spectrum from this organic EL element was different from the original light-emitting spectrum of 1,3,6,8-tetraphenylpyrene, which is the guest material, as shown in FIG. 9, and had a wide spectral bandwidth. Also, as for the light emission of this organic EL element, the light-emitting luminance and color purity had deteriorated compared with the case of Examples 1 to 4.

COMPARATIVE EXAMPLE 2

In Example 2, the organic EL element was manufactured as in Example 2, except that 1,3,6,8-tetraphenylpyrene was replaced by perylene expressed by the following structural formula (10).

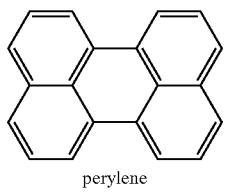

Structural formula (10)

perylene

Figure 10:
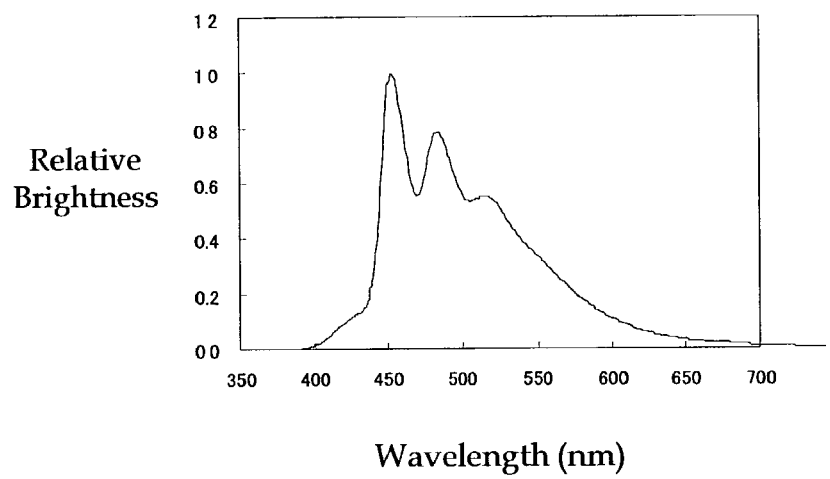
FIG. 10 is a graph showing an example of the light emission spectrum of the organic EL element of Comparative Example 2.

When a voltage was applied to the ITO electrode (positive electrode) and Al—Li alloy (negative electrode) in the manufactured organic EL element, in this organic EL element, a blue light emission was observed at a voltage of 6V or higher, and at an applied voltage of 10V, a high purity blue light emission of light-emitting luminance 115 cd/m² (CIE color coordinates of EL light emission: x=201, y=0.293) was observed. The light emission spectrum from this organic EL element was different from the original light-emitting spectrum of 1,3,6,8-tetraphenylpyrene, which is the guest material, as shown in FIG. 10. In addition to 450 nm to 530 nm, which is the original light emission wavelength of perylene, a light-emitting component of low efficiency from the perylene assembly was also present at longer wavelength. In this organic EL element, a "concentration-quenching" phenomenon was observed, and the light-emitting luminance and color purity fell sharply compared with the case of Examples 1–4.

According to the present invention, the problems inherent in the related art are solved, and an organic EL element having excellent light-emitting efficiency, light-emitting luminance and color purity of blue light, and a high performance organic EL display using this organic EL element, can be provided.

What is claimed is:

1. An organic EL element comprising:
   an organic thin film layer which contains a light-emitting layer between a positive electrode and a negative electrode,
   wherein the light-emitting layer comprises a 1,3,6,8-tetraphenylpyrene compound expressed by the following structural formula (1), and a carbazole derivative expressed by the following structural formula (2),

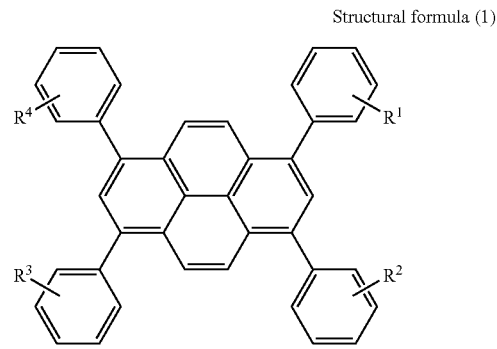

Structural formula (1)

in the structural formula (1), $R^1$ to $R^4$ may be identical or different, and may be one of a hydrogen atom and a substituent group,

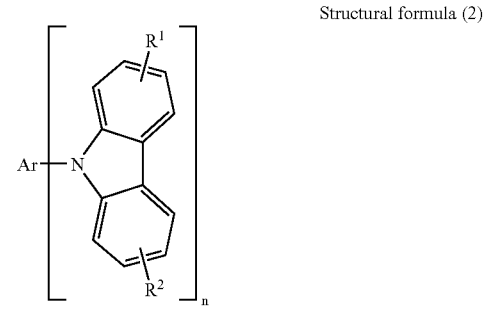

Structural formula (2)

in the structural formula (2), Ar represents an aromatic group or heterocyclic group, $R^1$ and $R^2$ may be identical or different, or may be one of a hydrogen atom and a substituent group, and n represents an integer.

2. An organic EL element according to claim 1, wherein the substituent group in the structural formula (1) is one of an alkyl group, a cycloalkyl group, and an aryl group, each of which may further comprise a substituent group; and the substituent group in the structural formula (2) is one of a halogen atom, and an alkyl group, an alkylsulfonyl group, an aralkyl group, an alkenyl group, a hydroxyl group, a cyano group, an amino group, an amide group, an acyl group, a carboxyl group, an alkoxy group, an alkoxycarbonyl group, an aryl group, an aryloxy group and an aromatic hydrocarbon group, each of which may further comprise a substituent group.

3. An organic EL element according to claim 1, wherein a carbazole derivative expressed by the structural formula (3) is one of: 4,4'-bis(9-carbazolyl)-biphenyl (CBP) expressed by the following structural formula (3), and a derivative thereof.

Structural formula (3)

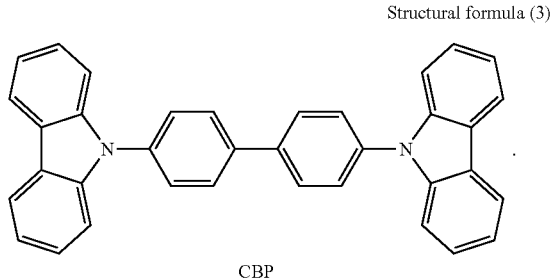

CBP

4. An organic EL element according to claim 1, wherein the content of the 1,3,6,8-tetraphenylpyrene compound expressed by the structural formula (1) in the layer containing the 1,3,6,8-tetraphenylpyrene compound is 0.1% by mass to 50% by mass.

5. An organic EL element according to claim 1, wherein the content of the 1,3,6,8-tetraphenylpyrene compound expressed by the structural formula (1) in the layer containing the 1,3,6,8-tetraphenylpyrene compound is 5% by mass to 30% by mass.

6. An organic EL element according to claim 1, further comprising a positive hole blocking layer in between the layer containing the 1,3,6,8-tetraphenylpyrene compound expressed by the structural formula (1) and the negative electrode.

7. An organic EL element according to claim 6, wherein the positive hole blocking layer in the organic EL element contains 2,9-dimethyl-4,7-diphenyl-1,10-phenthanthroline (bathocuproin, BCP) expressed by the following structural formula (7).

Structural formula (7)

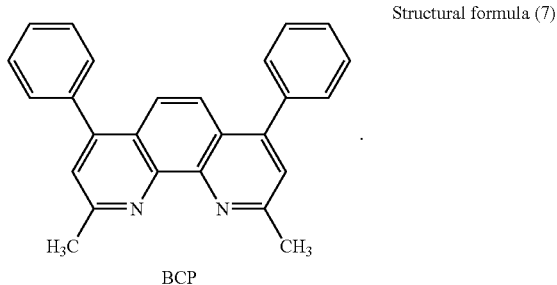

BCP

8. An organic EL element according to claim 1, wherein a CIE color coordinates of a EL light emission in the organic EL element is y<0.12.

9. An organic EL element according to claim 1, wherein a thickness of the light-emitting layer in the organic EL element is 5 nm to 50 nm.

10. An organic EL element according to claim 1, wherein the organic EL element is used for emission of a blue light.

11. An organic EL display comprising an organic EL element, wherein the organic EL element comprises:
an organic thin film layer which contains a light-emitting layer between a positive electrode and a negative electrode,
wherein the light-emitting layer comprises a 1,3,6,8-tetraphenylpyrene compound expressed by the following structural formula (1), and a carbazole derivative expressed by the following structural formula (2), Structural formula (1)

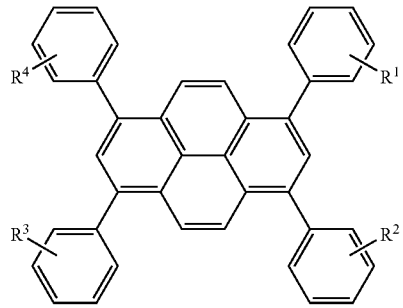

in the structural formula (1), $R^1$ to $R^4$ may be identical or different, and may be one of a hydrogen atom and a substituent group, Structural formula (2)

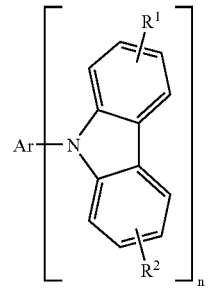

in the structural formula (2), Ar represents an aromatic group or heterocyclic group, $R^1$ and $R^2$ may be identical or different, or may be one of a hydrogen atom and a substituent group, and n represents an integer.

12. An organic EL display according to claim 11, comprising:
an organic EL element for emission of a blue color;
an organic EL element for emission of a green color; and
an organic EL element for emission of a red color;
wherein the organic EL element for emission of the blue color, the organic EL element for emission of the green color, and the organic EL element for emission of the red color comprises a same one of a positive hole injection layer and a positive hole transporting layer, and the organic EL element for emission of the blue color comprises an organic thin film layer which comprises a light-emitting layer between an positive electrode and a negative electrode, and one layer in this organic thin film layer contains a 1,3,6,8-tetraphenylpyrene compound expressed by the structural formula (1), and a carbazole derivative expressed by the structural formula (2).

13. An organic EL display according to claim 11, wherein the organic EL display is one of a passive matrix panel and an active matrix panel.

14. An organic EL element, comprising:
a substrate;
a positive electrode formed on the substrate;
an organic thin film layer laminated on the positive electrode, wherein the organic thin film layer comprises:
a positive hole transporting layer, comprising at least one selected from the group consisting of aromatic amine compounds, carbazole, imidazole, triazole, oxazole, oxadiazole, polyarylalkane, pyrrazoline, pyrrazolone, phenylene diamine, arylamine, amine-substituted chalcone, styryl anthracene, fluorenone, hydrazone, stibene, silazane, styryl amine, aromatic dimethylidene compounds, porphyrine compounds, polysilane compounds, poly(N-vinyl carbazole), aniline copolymers, electrically conducting oligomers and polymers, polythiophene and carbon film;

a light-emitting layer, wherein the light-emitting layer comprises a 1,3,6,8-tetraphenylpyrene compound expressed by the following structural formula (1), and a carbazole derivative expressed by the following structural formula (2), Structural formula (1)

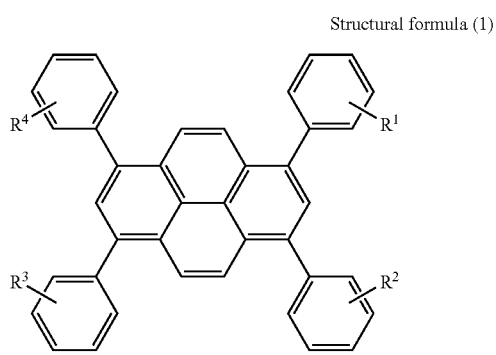

in the structural formula (1), $R^1$ to $R^4$ may be identical or different, and may be one of a hydrogen atom and a substituent group, Structural formula (2)

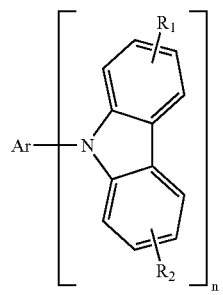

in the structural formula (2), Ar represents an aromatic group or heterocyclic group, $R^1$ and $R^2$ may be identical or different, or may be one of a hydrogen atom and a substituent group, and n represents an integer; and an electron transporting layer sequentially laminated on the organic thin film layer; and a negative electrode laminated on the electron transporting layer.

15. The organic EL element of claim 14, wherein the positive hole transporting layer comprises TPD (N,N'-diphenyl-N,N'-bis(3-methylphenyl)-[1,1'-biphenyl]-4,4'-diamine) expressed by the following structural formula (5), NPD (N,N'-dinaphthyl-N,N'-diphenyl-[1,1'-biphenyl]-4,4'-diamine) expressed by the following structural formula (6), or a combination thereof:

Structural formula (5)

TPD

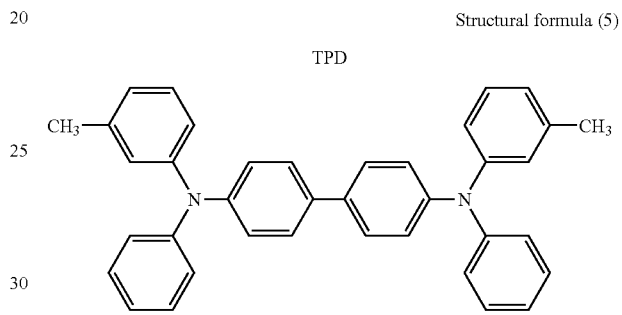

Structural formula (6)

NPD

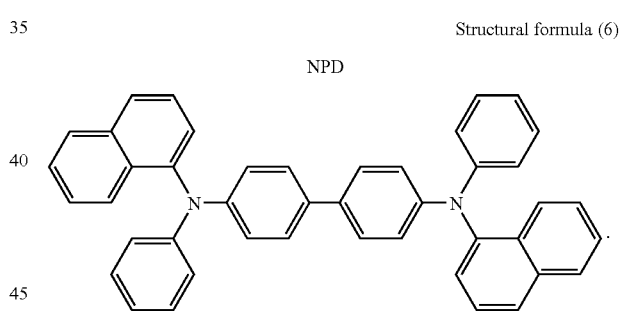

* * * * *